United States Patent
Kondo

(10) Patent No.: US 9,640,274 B1
(45) Date of Patent: May 2, 2017

(54) SEMICONDUCTOR MEMORY DEVICE

(71) Applicant: KABUSHIKI KAISHA TOSHIBA, Tokyo (JP)

(72) Inventor: Shigeo Kondo, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/247,916

(22) Filed: Aug. 26, 2016

(30) Foreign Application Priority Data

Mar. 15, 2016 (JP) ................................. 2016-051532

(51) Int. Cl.
| | |
|---|---|
| *G11C 16/08* | (2006.01) |
| *G11C 16/34* | (2006.01) |
| *G11C 16/10* | (2006.01) |
| *G11C 16/26* | (2006.01) |
| *G11C 16/30* | (2006.01) |
| *G11C 8/08* | (2006.01) |

(52) U.S. Cl.
CPC .......... *G11C 16/3459* (2013.01); *G11C 16/10* (2013.01); *G11C 16/26* (2013.01); *G11C 8/08* (2013.01); *G11C 16/08* (2013.01); *G11C 16/30* (2013.01)

(58) Field of Classification Search
CPC ............ G11C 16/08; G11C 8/08; G11C 16/30
USPC ............. 365/185.23, 230.06, 185.21, 185.22
See application file for complete search history.

(56) References Cited

U.S. PATENT DOCUMENTS

| | | | |
|---|---|---|---|
| 8,310,870 B2 | 11/2012 | Dutta et al. | |
| 8,837,223 B2 | 9/2014 | Sakamoto et al. | |
| 8,873,298 B2 | 10/2014 | Shiino et al. | |
| 2008/0068885 A1* | 3/2008 | Kong ................... | G11C 11/5628 365/185.03 |

* cited by examiner

*Primary Examiner* — Jason Lappas
(74) *Attorney, Agent, or Firm* — Patterson & Sheridan, LLP

(57) ABSTRACT

A semiconductor memory device includes word lines, bit lines, and memory cells at intersections of the word lines and the bit lines. A driver is configured to a voltage to a selected word line. A sense amplifier is configured to detect data of the memory cells. A controller is configured to control the driver and the sense amplifier. A writing sequence of writing data to a selected memory cell connected to the selected word line includes a plurality of writing loops including a write operation and a verify operation. The controller is configured to perform the write operation on the selected memory cell a predetermined number of times corresponding to write data to be written to the selected memory cell, without the verify operation, after a threshold voltage of the selected memory cell connected to the selected word line reaches a first level.

20 Claims, 9 Drawing Sheets

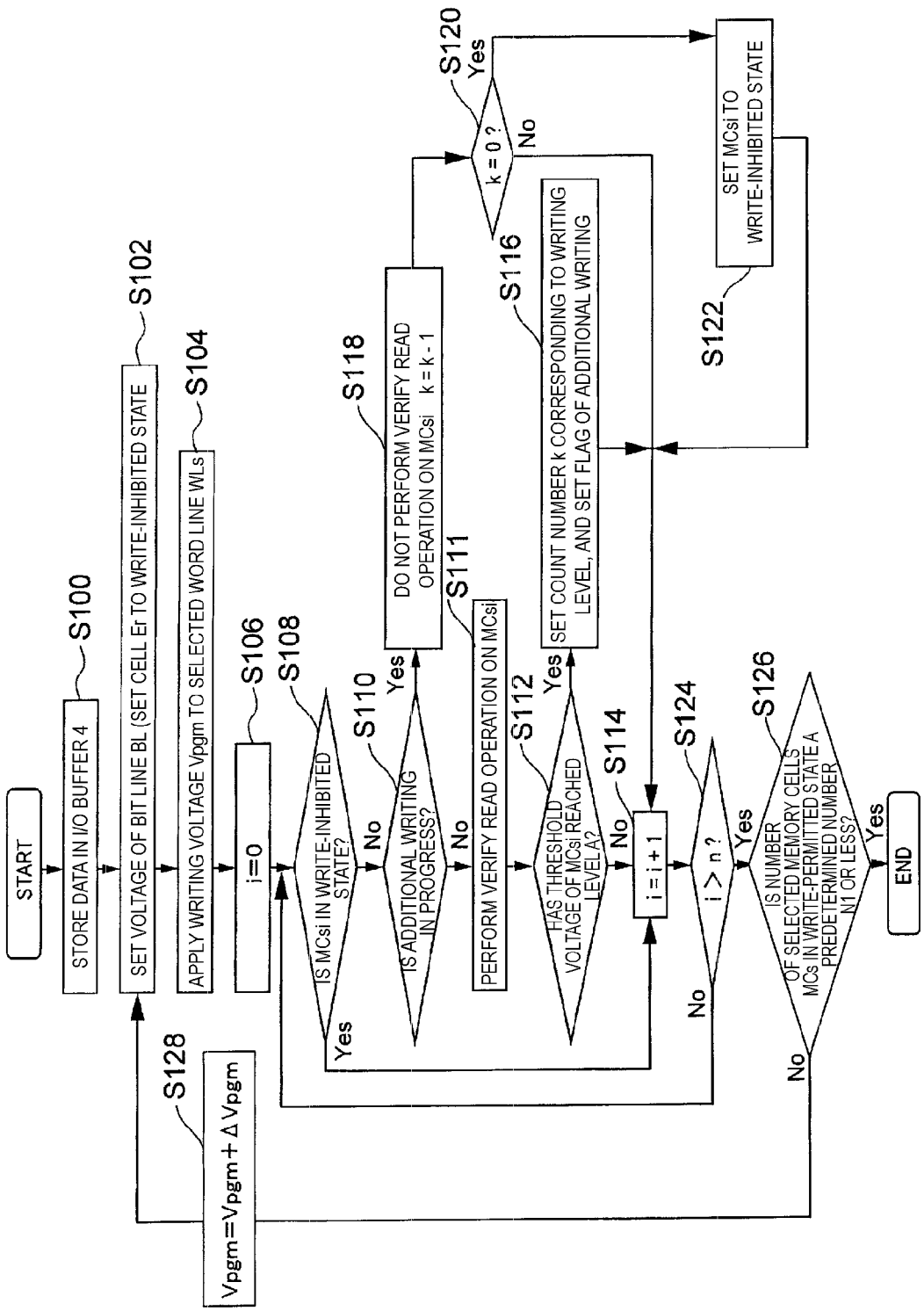

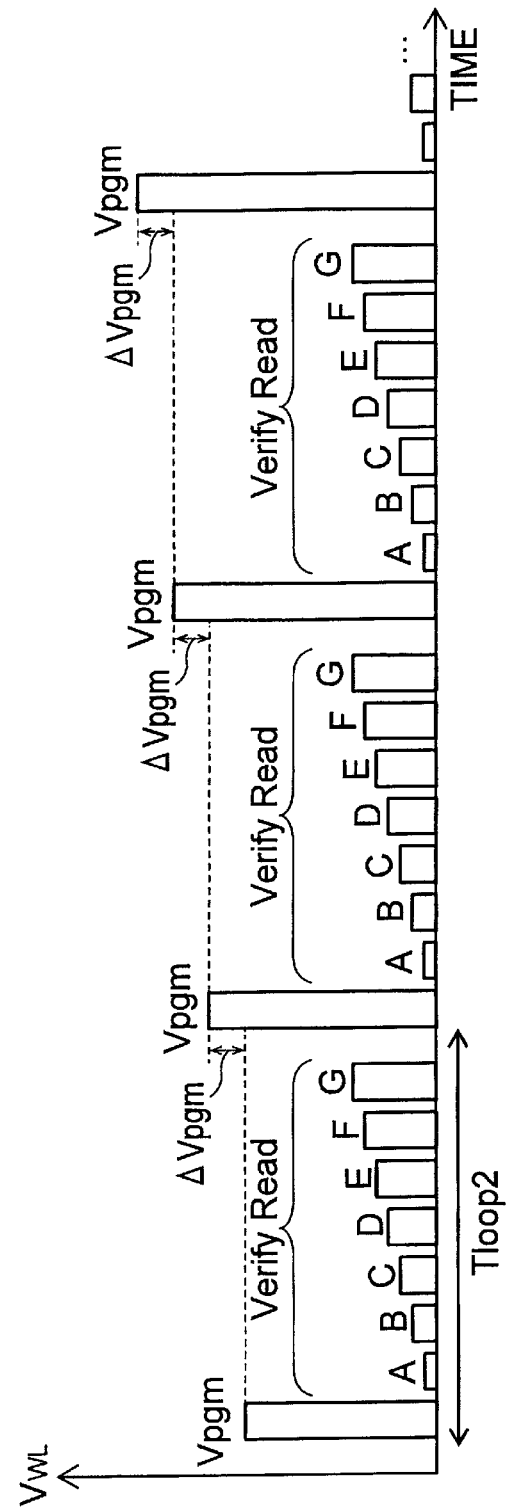

SEMICONDUCTOR MEMORY DEVICE

CROSS-REFERENCE TO RELATED APPLICATION

This application is based upon and claims the benefit of priority from Japanese Patent Application No. 2016-051532, filed Mar. 15, 2016, the entire contents of which are incorporated herein by reference.

FIELD

Embodiments described herein relate generally to a semiconductor memory device.

BACKGROUND

In nonvolatile memory, such as NAND-type electrically erasable programmable read-only memory (EEPROM), along with the miniaturization thereof, the inter-cell interference effect (proximity interference effect) is increasing. The increase in inter-cell interference effect may allow the threshold voltage of a memory cell to be changed as a result of writing to the adjacent memory cell, so that the threshold voltage distribution of memory cells may be widened.

On the other hand, memory cells capable of storing multi-valued information, such as a multi-level cell (MLC), have been developed. In an MLC, since the threshold voltage range of each level is relatively narrow, it is desirable that the threshold voltage distribution of memory cells be as narrow as possible. However, widening of the threshold voltage distribution of memory cells due to the inter-cell interference effect may make it difficult to keep the threshold voltage distribution of memory cells within the threshold voltage ranges of the MLC. Furthermore, narrowing the threshold voltage distribution of memory cells in consideration of the inter-cell interference effect may cause the writing time to increase.

DESCRIPTION OF THE DRAWINGS

FIG. 7 is a flowchart illustrating an example of a foggy writing sequence according to the first embodiment.

FIG. 8 is a graph illustrating word line voltages $V_{WL}$ in fine writing.

DETAILED DESCRIPTION

Embodiments provide a semiconductor memory device capable of narrowing the threshold voltage distribution of memory cells without allowing the writing time to increase.

In general, according to one embodiment, a semiconductor memory device includes a plurality of word lines, a plurality of bit lines, and a plurality of memory cells at intersections of the word lines and the bit lines. A word line driver is configured to apply a voltage to a selected word line from among the plurality of word lines. A sense amplifier is configured to detect data of the memory cells. A controller is configured to control the word line driver and the sense amplifier. A writing sequence of writing data to a selected memory cell connected to the selected word line includes a plurality of writing loops including a write operation during which the word line driver applies a writing voltage to the selected word line and a verify operation during which the sense amplifier detects data of the selected memory cell. The controller is configured to perform the write operation on the selected memory cell a predetermined number of times corresponding to write data to be written to the selected memory cell, without the verify operation, after a threshold voltage of the selected memory cell connected to the selected word line reaches a first level.

Hereinafter, embodiments will be described with reference to the drawings. The embodiments described herein should not be construed to limit the invention.

First Embodiment

Figure 1:
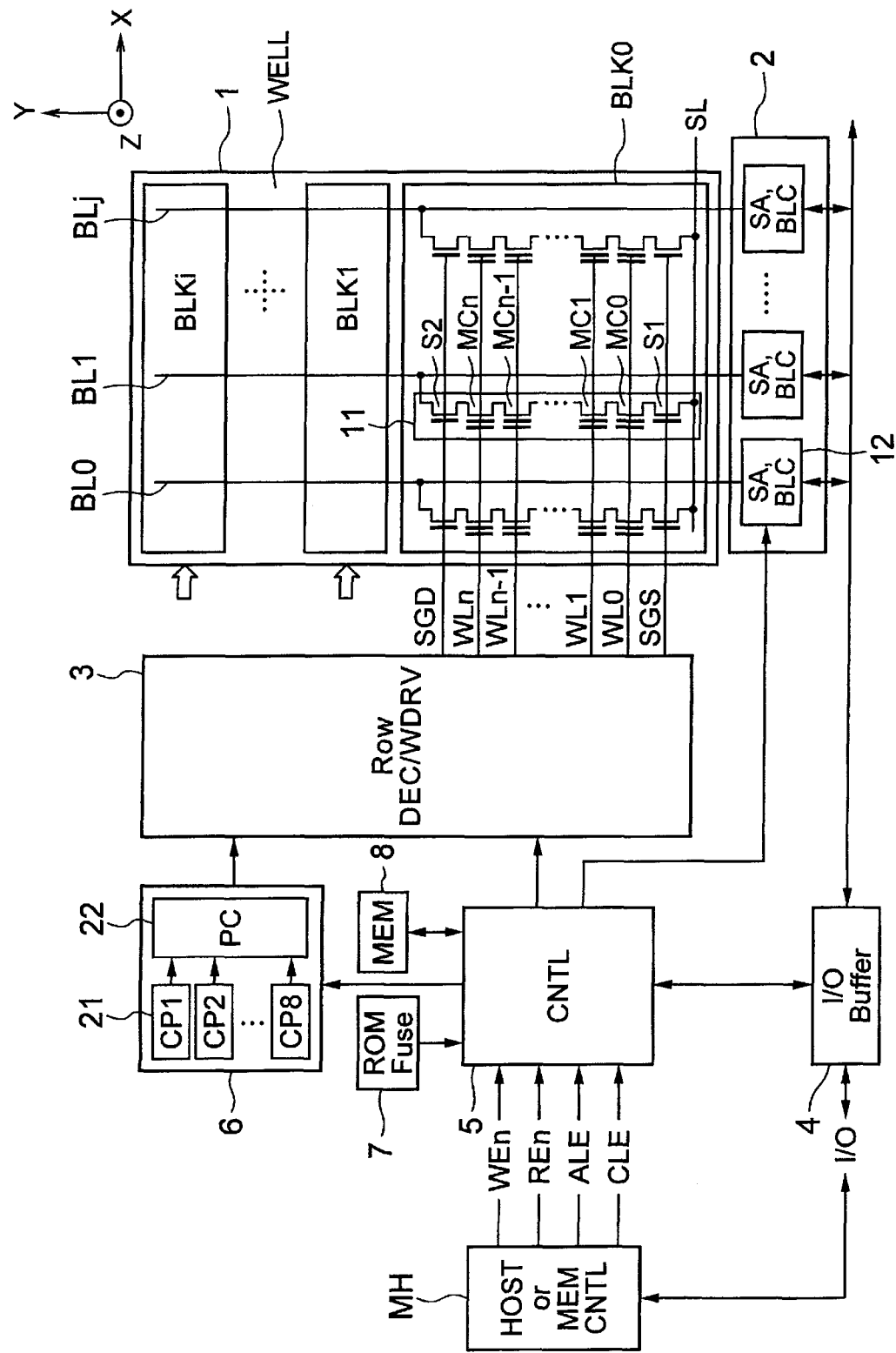
FIG. 1 illustrates an example of a configuration of a nonvolatile semiconductor memory device (hereinafter also referred to simply as a "memory") according to a first embodiment.

FIG. 1 illustrates an example of a configuration of a nonvolatile semiconductor memory device (hereinafter also referred to simply as a "memory") according to a first embodiment. The memory according to the present embodiment is, for example, a NAND-type EEPROM.

The memory according to the present embodiment includes a memory cell array 1, a sense amplifier 2, a row decoder 3, an input-output (I/O) buffer 4, a controller 5, a voltage generation circuit 6, a read-only memory (ROM) fuse 7, and a data storage circuit 8.

The memory cell array 1 includes a plurality of memory blocks BLK0 to BLKi (i being an integer equal to or greater than 2) formed on the same well. Furthermore, as illustrated in FIG. 1, each memory block BLK includes a plurality of NAND cell units 11, each extending in the Y-direction, which are arranged side by side in the X-direction. Moreover, each NAND cell unit 11 includes a plurality of memory cells MC0 to MC63 connected in series and selection transistors S1 and S2 respectively connected to the two opposed ends of the plurality of memory cells MC0 to MC63. The memory cells MC are provided corresponding to intersection points between word lines WL and bit lines BL.

FIG. 1 also illustrates word lines WL0 to WL63 and selection gate lines SGS and SGD for the memory block BLK0. The word lines WL0 to WL63 are respectively connected to the control gates of the memory cells MC0 to MC63, and each extends in the X-direction. Furthermore, the selection gate lines SGS and SGD are respectively connected to the gates of the selection transistors S1 and S2, and each extends in the X-direction. Moreover, the word lines WL0 to WL63 and the selection gate lines SGS and SGD are shared by the plurality of NAND cell units 11, which are arranged side by side in the X-direction.

Furthermore, the sources of the respective selection transistors S1 included in the memory block BLK0 are connected to the same source line SL. Moreover, the drains of the respective selection transistors S2 included in the memory block BLK0 are respectively connected to the corresponding bit lines BL0 to BLj (j being an integer equal to or greater than 2). As illustrated in FIG. 1, the source line SL extends in the X-direction, and the bit lines BL0 to BLj each extend in the Y-direction.

The sense amplifier 2 includes a plurality of pairs 12 of a sense amplifier SA and a bit line controller BLC. The sense amplifier SA is a circuit that reads data from the memory cell MC via the corresponding one of the bit lines BL0 to BLj. The sense amplifier SA detects the logic of the data by comparing a voltage corresponding to the data from the memory cell MC with a reference voltage. The bit line controller BLC selectively drives one of a plurality of bit lines BL or selectively drives a plurality of bit lines BL according to an address or addresses received from the controller 5. The bit line controller BLC performs a write control operation, a verify read operation, and a read operation by controlling a voltage of the selected bit line BL.

For example, the sense amplifier 2 detects data stored in a selected memory cell MC connected to the selected word line WL and the selected bit line BL in the verify read operation and the read operation. The sense amplifier 2 further includes a data latch circuit (not illustrated), and is thus capable of temporarily holding data detected by the sense amplifier SA.

The row decoder (word line driver) 3 is a circuit that selects one of a word line or a selected gate line and applies a voltage to the word line or the selected gate line.

The I/O buffer 4 is a circuit that that performs sending and receiving of data between the sense amplifier 2 and an external input-output terminal and performs receiving of command data or address data from the controller 5.

The controller 5 performs various control operations on the memory cell array 1. The controller 5 receives, from, for example, an external host or memory controller (MH), external control signals, such as a write enable signal WEn, a read enable signal REn, an address latch enable signal ALE, and a command latch enable signal CLE. In response to the external control signals, the controller 5 controls the row decoder (word line driver) 3 and the sense amplifier 2 to perform a write operation, a read operation, an erasure operation, and other operations.

The voltage generation circuit 6 includes a plurality of booster circuits 21 and a pulse generation circuit 22. The voltage generation circuit 6 switches the number of booster circuits 21 to be driven based on a control signal from the controller 5. Furthermore, the voltage generation circuit 6 controls the pulse generation circuit 22 to regulate the pulse width or pulse height of a pulse voltage.

The ROM fuse 7 is a memory unit for storing setting values of the pulse width or pulse height of pulse voltages used at the time of writing or erasure. For example, the ROM fuse 7 stores a writing voltage (program voltage) Vpgm to be applied to a word line in the write operation, a rising width (step-up width) ΔVpgm of the writing voltage, and the number of times of execution of a no-verify loop, which is described below.

The data memory circuit 8 is a rewritable nonvolatile memory circuit for storing various pieces of data used for control over the memory cell array 1.

Figure 2:
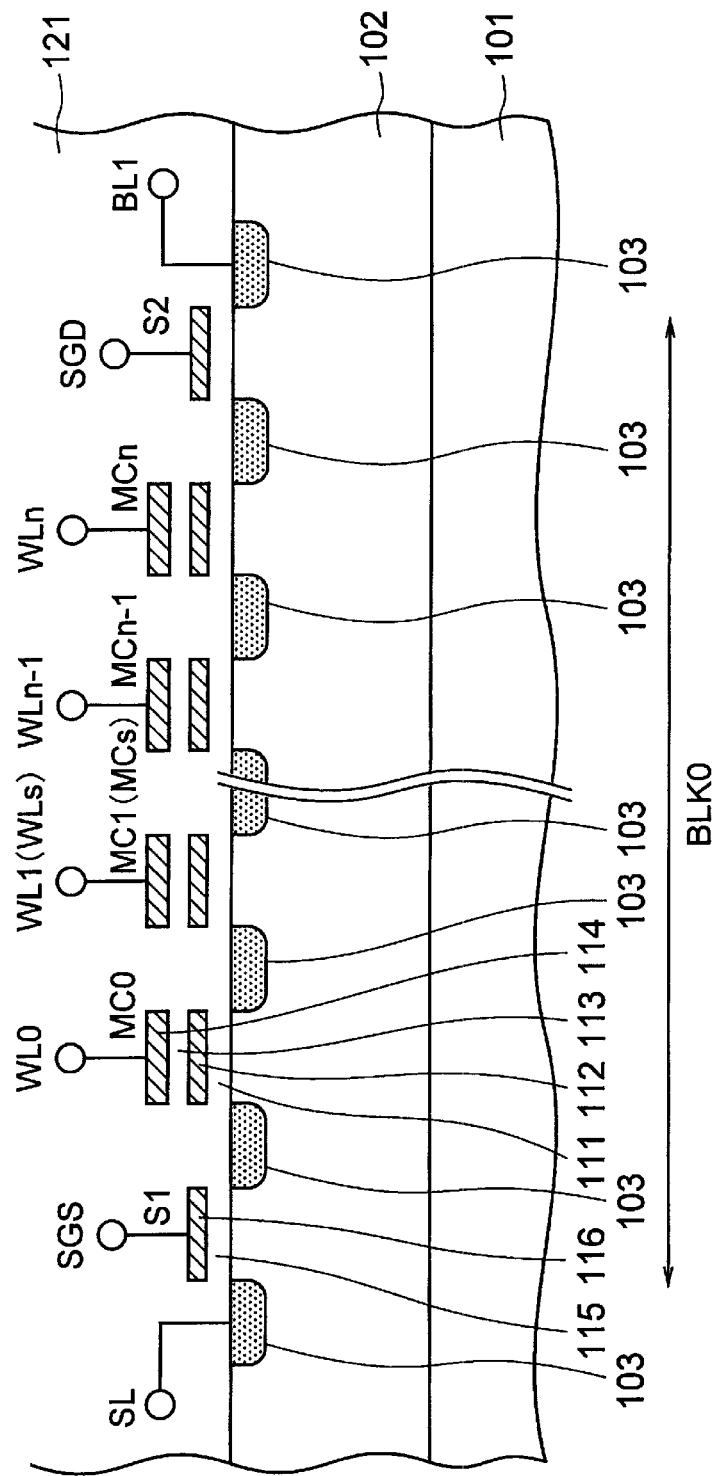
FIG. 2 is a schematic sectional view illustrating an example of a configuration of a NAND cell unit.

FIG. 2 is a schematic sectional view illustrating an example of a configuration of the NAND cell unit 11. The NAND cell unit 11 includes a plurality of memory cells MC connected in series and two selection transistors S1 and S2 connected to the two ends of the plurality of memory cells MC. The selection transistor S1 on the source side is connected to the source line SL, and the selection transistor S2 on the drain side is connected to the bit line BL.

The memory cells MC0 to MC63 and the selection transistors S1 and S2 are formed on the well 102 in a semiconductor substrate 101, and are connected in series by diffusion layers 103 in the well 102. These transistors are covered with an interlayer insulating film 121.

Each memory cell MC includes a charge storage layer (for example, a floating gate) 112 and a control gate 114. The charge storage layer 112 is provided on the semiconductor substrate 101 via a gate insulating film 111. The control gate 114 is formed on the charge storage layer 112 on an inter-gate insulating film 113 therebetween. Furthermore, each of the selection transistors S1 and S2 includes a gate electrode 116 formed on the semiconductor substrate 101 on a gate insulating film 115 therebetween. Moreover, the charge storage layer 112 can be replaced with an insulating film having a charge storage function (for example, a silicon nitride film).

The control gate 114 is connected to one of the word lines WL0 to WL63. The memory cell MC0 on one end of the NAND cell unit 11 is connected to the source line SL via the selection transistor S1. The memory cell MC63 on the other end of the NAND cell unit 11 is connected to the bit line BL via the selection transistor S2. Additionally, the numbers of word lines WL, bit lines BL, and memory cells MC are not specifically limited. Moreover, the memory cell MC can be any one of a single-level cell (SLC), a multi-level cell (MLC), a triple-level cell (TLC), and a quadruple-level cell (QLC) or higher level.

Figure 3:
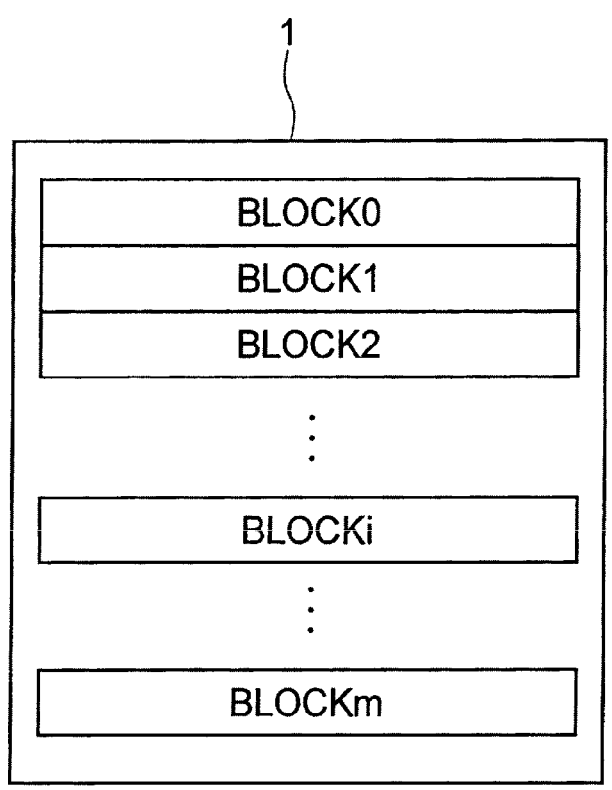
FIG. 3 illustrates a concept of elements, such as blocks and pages, of a memory cell array.

FIG. 3 illustrates a concept of elements, such as blocks and pages, of the memory cell array 1. The memory cell array 1 is divided into memory blocks (hereinafter also referred to as "blocks") BLOCK0 to BLOCKm. In this example, each of the blocks BLOCK0 to BLOCKm is a minimum unit of data erasure. Each of the blocks BLOCK0 to BLOCKm is composed of a plurality of pages. Each page is a unit of data reading or data writing. Each page corresponds to the word line WL, and includes data in a plurality of memory cells MC specified by specific addresses.

The NAND-type EEPROM performs a write operation and a read operation, for example, based on each page of 512 bytes to 8 K bytes. Thus, the bit line controller BLC is able to concurrently control bit lines BL corresponding to 512 bytes to 8 K bytes in a page. The sense amplifier SA detects data in the memory cell MC via the bit lines BL.

Next, a data write operation of the memory according to the present embodiment is described. The data write operation (writing sequence) is performing by iterating a writing loop including a write operation and a verify read operation. The write operation is an operation to write data by applying a writing voltage to a selected word line and thereby raising the threshold voltage of a selected memory cell. The verify read operation is an operation to verify whether the threshold voltage of the selected memory cell has reached a verify level, in other words, whether intended data has been written to the selected memory cell. The verify read operation includes an operation to read data from the selected memory cell (read operation) and an operation to verify the level (the threshold voltage of the selected memory cell) of the read data (verify operation).

In the writing sequence, each time the writing loop is iterated, the word line driver 3 raises (steps up) the voltage of a selected word line in increments of ΔVpgm. With this, the threshold voltage of a selected memory cell connected to the selected word line rises in increments of about ΔVpgm each time the writing sequence is performed.

As the threshold voltage of the selected memory cell gradually rises, the threshold voltage of the selected memory cell gradually comes close to the verify level (the reference level) and eventually reaches the verify level. This means that the selected memory cell MC has passed (succeeded in) the verify read operation. When the memory cell MC passes the verify read operation, writing to the selected memory cell MC ends, and the bit line corresponding to the selected memory cell enters a non-selected state (write-inhibited state). For example, the bit line controller BLC raises and fixes the voltage of a bit line corresponding to the selected memory cell MC which has passed the verify read operation, so that, even if a writing voltage is applied to the selected word line, the voltage difference is prevented from being applied to the selected memory cell. This results in that, in a subsequent writing loop, data is not written any more to the selected memory cell MC which has passed the verify. Accordingly, the threshold voltage of the selected memory cell is distributed in a range equal to or greater than the verify level (reference voltage) and in the neighborhood of the verify level.

Furthermore, the selected state refers to a state in which, when a writing voltage is applied to the selected word line, the voltage of a bit line is lowered in such a way that a voltage is applied between the channel of the selected memory cell and the word line. The non-selected state refers to a state in which, even when a writing voltage is applied to the selected word line, the voltage of a bit line is fixed in such a way that the voltage difference between the channel of the selected memory cell and the word line is reduced.

Control over the writing sequence is performed by the controller 5, the sense amplifier 2, and the row decoder (word line driver) 3. Moreover, the writing sequence is performed in the order of word lines WL0, WL1, WL62, WL63.

Next, the writing sequence according to the present embodiment is further described in detail.

Figure 4A:
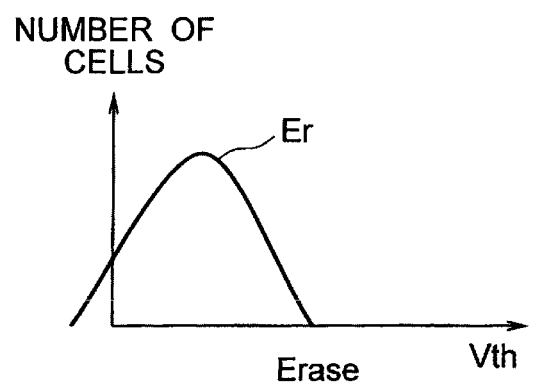
FIGS. 4A, 4B, and 4C are graphs illustrating, with threshold voltage distributions, various stages of a writing sequence of writing 3-bit data to a given writing-target page.
Figure 4B:
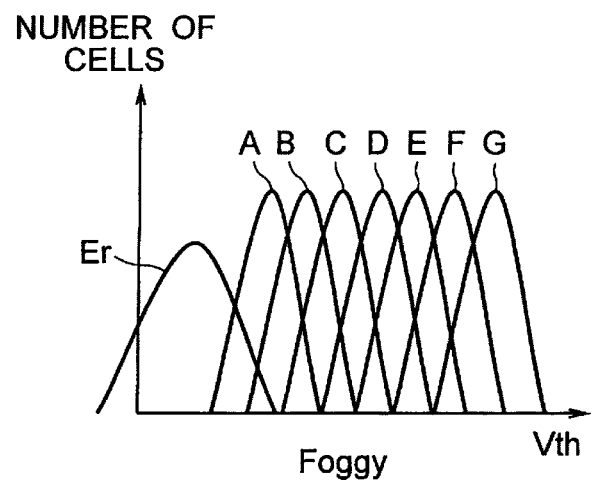
Figure 4C:
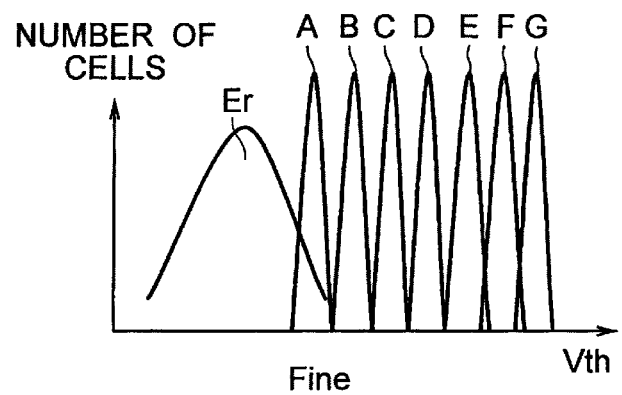

FIGS. 4A, 4B, and 4C are graphs illustrating, with threshold voltage distributions, various stages of a writing sequence of writing 3-bit data to a given writing-target page. The ordinate axis of these graphs indicates the number of selected memory cells MCs, and the abscissa axis thereof indicates the threshold voltage of a selected memory cell MCs. Moreover, the ordinate axis is logarithmically expressed.

The memory according to the present embodiment uses a foggy-fine method to write 3-bit data to a memory cell MC. The foggy-fine method is a method of, after roughly writing data of each level by foggy writing, precisely writing data for each level by fine writing. Furthermore, in some cases, prior to foggy writing, lower middle (LM) writing, which temporarily writes data at a lower level, can be performed. In the present embodiment, the foggy-fine method includes foggy writing and fine writing, and the above-mentioned writing sequence is performed in each stage. Moreover, in a case where LM writing is performed, foggy writing and fine writing are performed after the LM writing is performed.

FIG. 4A illustrates a threshold voltage distribution of selected memory cells MCs in an initial state (erased state). All of the memory cells MC included in the block BLOCK are brought into an erased state (hereinafter also referred to as a "level Er") by block erasure. Accordingly, the threshold voltages of the memory cells MC in the block BLOCK are at the level Er, which is the lowest in the logical data levels. Moreover, the level means the level of a threshold voltage, and is, in the following description, in a relationship where Er<A<B<C<D<E<F<G.

(Foggy Writing)

Next, a low-order page, a middle-order page, and a high-order page are concurrently written. Writing of the low-order page, the middle-order page, and the high-order page includes a stage of foggy writing illustrated in FIG. 4B and a stage of fine writing illustrated in FIG. 4C. Foggy writing is a stage of roughly writing each piece of data. Foggy writing causes data of any one of levels Er, A, B, C, D, E, F, and G to be written, to some extent, to the selected memory cell MCs that is at the level Er, as illustrated in FIG. 4B, but writing is roughly performed in a threshold voltage distribution broader than that of fine writing.

Here, while, writing to the memory cells MCs using foggy writing according to the present embodiment, a verify read operation is performed in the writing loop until the threshold voltages of all of the selected memory cells MCs to which data at the levels of A to G are to be written have the level A (first level) voltage, which is one level higher than the level Er, while the verify read operation for the levels B to G is not performed. In this case, after the threshold voltage of a certain selected memory cell MCs reaches the level A, the need to perform the verify read operation on the selected memory cell MCs is eliminated regardless of the level of writing to the selected memory cell MCs. Accordingly, the controller 5 performs the write operation according to write data in a subsequent writing loop with respect to the selected memory cell MCs that has reached the verify level of the level A, but does not treat the selected memory cell MCs as a target of the verify read operation. In the verify read operation, the sense amplifier 2 detects whether the selected memory cell MCs has reached the verify level of level A, but does not detect whether it has reached the verify level of another level. In this case, subsequent write operations on the selected memory cells MCs that have reached the level A are continuously performed only in writing loops for a predetermined number of times corresponding to levels of write data. The predetermined number of times is described below. On the other hand, with respect to the selected memory cells MCs that have not reached the level A, both the read operation and the verify read operation of the writing loop are performed. In this way, during the foggy writing, the controller 5 performs the verify read operation for the level A with respect to the selected memory cells MCs, but does not perform the verify read operation for the other levels B to G. Furthermore, the controller 5 performs the verify read operation on the selected memory cells MCs to which data of the levels A to G are to be written until each selected memory cell MCs reaches the verify level of level A, but excludes from the verification operation the selected memory cell MCs that have reached the level A. Furthermore, even if some selected memory cells MCs have reached the level A, both the write operation and the verify read operation are performed in all of the writing loops for the other selected memory cells MCs that have not reached the level A.

Figure 5:
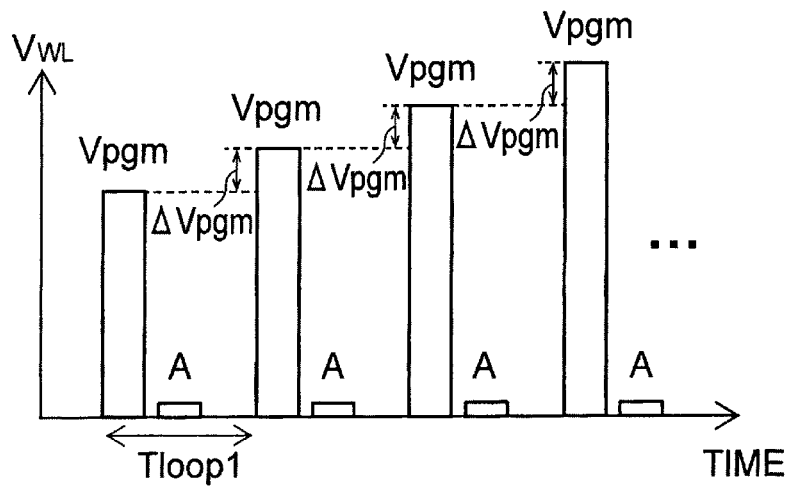
FIG. 5 is a graph illustrating word line voltages $V_{WL}$ in foggy writing according to the first embodiment.

FIG. 5 is a graph illustrating word line voltages $V_{WL}$ in the foggy writing step according to the first embodiment. The ordinate axis indicates the word line voltage $V_{WL}$, and the abscissa axis indicates time. As illustrated in FIG. 5, after performing writing to the selected memory cell MCs at the writing voltage Vpgm, the controller 5 performs the verify read operation for the level A, but does not perform the verify read operation for the levels B to G.

Furthermore, the controller 5 excludes the selected memory cell MCs that has reached the level A as a target of the verify read operation. Subsequent write operations on the selected memory cells MCs that have reached the level A in the writing loop are continuously performed in the writing loops for a predetermined number of times corresponding to levels of write data (A to G). After that, the controller 5 brings the selected memory cells MCs into a non-selected state until starting of the fine writing.

As the writing loop is iteratively performed, along with step-up of the voltage of the selected word line WLs, the threshold voltage of the selected memory cell MCs rises in increments of about the step-up potential $\Delta Vpgm$. Accordingly, although it is not possible to accurately detect the threshold voltage of the selected memory cell MCs, the number of times of execution of the write operation to a memory cell MC enables estimating of the threshold voltage of the selected memory cell MCs to some extent.

For example, the step-up potential $\Delta Vpgm$ is supposed to be approximately equal to a threshold voltage difference between adjacent levels of write data. In other words, the step-up potential $\Delta Vpgm$ is supposed to be approximately equal to a threshold voltage difference between the level A and the level B, a threshold voltage difference between the level B and the level C, a threshold voltage difference between the level C and the level D, a threshold voltage difference between the level D and the level E, a threshold voltage difference between the level E and the level F, and a threshold voltage difference between the level F and the level G. In this case, the threshold voltage of the selected memory cell MCs rises in increments of one level each time the write operation is performed. Accordingly, the number of times of an additional write operation (hereinafter also referred to as "additional writing") which is performed on the selected memory cell MCs that have reached the level A is the number of times corresponding to the threshold voltage levels (levels A to G) of data to be written to the selected memory cell MCs. In the present embodiment, the number of times of additional writing is equal to the number of threshold voltage levels equal to or lower than the threshold voltage level of write data and higher than the level A (the number of levels higher than the level A and equal to or lower than the threshold voltage level of write data). For example, in the case of writing data at the level A (first level) to a selected memory cell MCs, the number of times of additional writing is 0. In the case of writing data of the level B (second level) to a selected memory cell MCs, the number of threshold voltage levels equal to or lower than the level B and higher than the level A is 1 (level B). Accordingly, in this case, the number of times of additional writing is 1. In the case of writing data of the level C (third level) to a selected memory cell MCs, the number of threshold voltage levels equal to or lower than the level C and higher than the level A is 2 (levels B and C). Accordingly, in this case, the number of times of additional writing is 2. In the case of writing data of the level D (fourth level) to a selected memory cell MCs, the number of threshold voltage levels equal to or lower than the level D and higher than the level A is 3 (levels B, C, and D). Accordingly, in this case, the number of times of additional writing is 3. In the case of writing data of the level E (fifth level) to a selected memory cell MCs, the number of threshold voltage levels equal to or lower than the level E and higher than the level A is 4 (levels B, C, D, and E). Accordingly, in this case, the number of times of additional writing is 4. In the case of writing data of the level F (sixth level) to a selected memory cell MCs, the number of threshold voltage levels equal to or lower than the level F and higher than the level A is 5 (levels B, C, D, E, and F). Accordingly, in this case, the number of times of additional writing is 5. In the case of writing data of the level G (seventh level) to a selected memory cell MCs, the number of threshold voltage levels equal to or lower than the level G and higher than the level A is 6 (levels B, C, D, E, F, and G). Accordingly, in this case, the number of times of additional writing is 6. In this way, the number of times of an additional write operation (the number of times of additional writing) that is performed on a selected memory cell MCs after the selected memory cell MCs has reached the level A corresponds to each of threshold voltage levels of write data, and is equal to the number of threshold voltage levels higher than the level A from among the threshold voltage levels of write data.

The correspondence relationship between the threshold voltage levels (levels A to G) and the numbers of times of additional writing corresponding respectively thereto can be stored in the ROM fuse 7, which serves as a first memory unit. For example, numbers 0 to 6 are stored in the ROM fuse 7 as the numbers of times of additional writing respectively corresponding to the levels A to G.

Furthermore, the numbers of times of additional writing respectively corresponding to a plurality of selected memory cells MCs connected to a selected word line WLs can be stored in the data memory circuit 8, which serves as a second memory unit. For example, the controller 5 determines the number of times of additional writing corresponding to write data with respect to each of selected memory cells MC0 to MCn in a given page. At this time, the controller 5 refers to the correspondence relationship between threshold voltage levels and the numbers of times of additional writing, which is stored in the ROM fuse 7, and determines the number of times of additional writing corresponding to write data to be written to the respective selected memory cells MCs. The number of times of additional writing determined with respect to the respective selected memory cells MC0 to MCn are stored in the data memory circuit 8.

After the threshold voltage of a selected memory cell MCs has reached the level A, the controller 5 performs additional write operations according to the number of times of additional writing set to the selected memory cell MCs. At this time, the controller 5 iterates the write operation while stepping up the writing voltage of the selected word line WLs, but does not perform the verify read operation on the selected memory cell MCs that have previously reached the level A. This causes the threshold voltage of the selected memory cell MCs to reach the desired threshold level corresponding to the number of times of additional writing.

Figure 6:
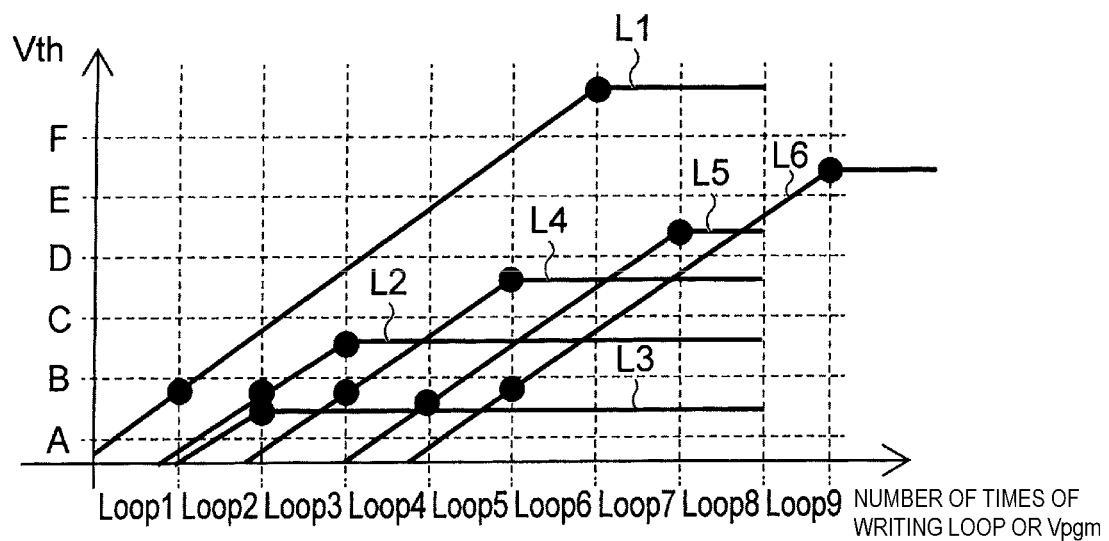
FIG. 6 is a graph illustrating a relationship between the number of times of a writing loop and the threshold voltage of a selected memory cell MCs in foggy writing.

For example, FIG. 6 is a graph illustrating a relationship between the number of times of the writing loop and the threshold voltage of a selected memory cell MCs in the foggy writing. The abscissa axis indicates the number of times of the writing loop or the writing voltage Vpgm. The ordinate axis indicates the threshold voltage of the selected memory cell MCs. Loop1 to Loop9 on the abscissa axis denote writing loops. A to F on the ordinate axis denote threshold voltage levels of write data.

Line L1 indicates a change of the threshold voltage of the selected memory cell MCs in the case of writing data of the level F. Line L2 indicates a change of the threshold voltage of the selected memory cell MCs in the case of writing data of the level B. Line L3 indicates a change of the threshold voltage of the selected memory cell MCs in the case of writing data of the level A. Line L4 indicates a change of the threshold voltage of the selected memory cell MCs in the case of writing data of the level C. Line L5 indicates a change of the threshold voltage of the selected memory cell MCs in the case of writing data of the level D. Line L6 indicates a change of the threshold voltage of the selected memory cell MCs in the case of writing data of the level E.

The threshold voltage of the selected memory cell MCs indicated by the line L1 reaches the level A in the writing loop Loop1. In this case, an ordinary writing loop (both of the write operation and the verify read operation) is performed up to the writing loop Loop1, and the selected memory cell MCs is treated as a target of the verify read operation. After that, when the threshold voltage of the selected memory cell MCs has reached the level A in the writing loop Loop1, additional writing is performed five times (Loop2 to Loop6) on the selected memory cell MCs. During this writing, the selected memory cell MCs indicated by the line L1 is not treated as a target of the verify read operation, i.e., no further verification is performed as it is written to level F. The threshold voltage of the selected memory cell MCs rises in increments of about one level each time additional writing is performed. With this, when the writing loops Loop2 to Loop6 are performed, the threshold voltage of the selected memory cell MCs indicated by the line L1 is assumed to reach the vicinity of the level F.

The threshold voltage of the selected memory cell MCs indicated by the line L2 reaches the level A in the writing loop Loop2. In this case, an ordinary writing loop is performed up to the writing loop Loop2, and after that, when the threshold voltage of the selected memory cell MCs has reached the level A, additional writing is performed once (Loop3) on the selected memory cell MCs. When the writing loop Loop3 is performed, the threshold voltage of the selected memory cell MCs indicated by the line L2 is assumed to reach the vicinity of the level B.

The threshold voltage of the selected memory cell MCs indicated by the line L3 reaches the level A in the writing loop Loop2. In this case, an ordinary writing loop is performed up to the writing loop Loop2, and after that, when the threshold voltage of the selected memory cell MCs has reached the level A in the writing loop Loop2, additional writing is not performed on the selected memory cell MCs. Accordingly, the threshold voltage of the selected memory cell MCs indicated by the line L3 reaches the level A.

The threshold voltage of the selected memory cell MCs indicated by the line L4 reaches the level A in the writing loop Loop3. In this case, an ordinary writing loop is performed up to the writing loop Loop3, and after that, when the threshold voltage of the selected memory cell MCs has reached the level A, additional writing is performed twice (Loop4 and Loop5) on the selected memory cell MCs. When the writing loops Loop4 and Loop5 are performed, the threshold voltage of the selected memory cell MCs indicated by the line L4 is assumed to reach the vicinity of the level C.

The threshold voltage of the selected memory cell MCs indicated by the line L5 reaches the level A in the writing loop Loop4. In this case, an ordinary writing loop is performed up to the writing loop Loop4, and after that, when the threshold voltage of the selected memory cell MCs has reached the level A, additional writing is performed three times (Loop5 to Loop7) on the selected memory cell MCs. When the writing loops Loop5 to Loop7 are performed, the threshold voltage of the selected memory cell MCs indicated by the line L5 is assumed to reach the vicinity of the level D.

The threshold voltage of the selected memory cell MCs indicated by the line L6 reaches the level A in the writing loop Loop5. In this case, an ordinary writing loop is performed up to the writing loop Loop5, and after that, when the threshold voltage of the selected memory cell MCs has reached the level A, additional writing is performed four times (Loop6 to Loop9) on the selected memory cell MCs. When the writing loops Loop6 to Loop9 are performed, the threshold voltage of the selected memory cell MCs indicated by the line L6 is assumed to reach the vicinity of the level E. Furthermore, although not illustrated, in a case where the number of times of execution of additional writing is 6, the threshold voltage of the selected memory cell MCs is assumed to reach the vicinity of the level G. Moreover, in the case of keeping the threshold voltage of the selected memory cell MCs at the level Er, the controller 5 performs neither of the two operations of the writing loop on those selected memory cell MCs.

In this way, when, after the threshold voltage of the selected memory cell MCs reaches the level A, additional writing is performed a predetermined number of times (0 to 6), the threshold voltage of the selected memory cell MCs is assumed to reach any one of the levels A to G based on the number of times of writing thereto. This completes the foggy writing of these memory cells MCs.

Furthermore, threshold voltages obtained after writing is performed at the same writing voltage Vpgm on selected memory cells MCs are widely distributed in a similar way to that illustrated in FIG. 4A. Therefore, the number of times of the writing loop required for the threshold voltage to reach the level A varies depending on the threshold voltage of the selected memory cell MCs, and is difficult to estimate. However, the number of times of the writing loop (the number of times of additional writing) required for the threshold voltage to reach the threshold voltage level of write data after the threshold value reaches the level A is able to be readily estimated based on the step-up width $\Delta Vpgm$.

After the foggy writing, the threshold voltages of selected memory cells MCs of the levels A to G do not exceed the respective threshold voltages corresponding to the levels A to G in the fine writing, and have a wider voltage distribution than possible with the fine writing. In this way, during the foggy writing, elements of data at one of the levels A to G are roughly written to the selected memory cells MCs as illustrated in FIG. 4B.

FIG. 7 is a flowchart illustrating an example of a foggy writing sequence according to the first embodiment. FIG. 7 illustrates writing to a selected memory cell MCsi (i=0 to n) connected to a given selected word line WLs.

First, in step S100, the controller 5 stores data to be written to the selected memory cell MCsi and the adjacent memory cell MC into the I/O buffer 4.

Then, in step S102, the bit line controller BLC applies a low-level voltage (for example, a source voltage) to a selected bit line BL and fixes the other non-selected bit lines BL to a high-level voltage. This brings the non-selected bit lines BL into a write-inhibited state. Moreover, the bit line controller BLC also fixes a selected bit line BL connected to a selected memory cell MCs to which data of the level Er is to be written to a high-level voltage, thus bringing the selected bit line BL into a write-inhibited state.

Then, in step S104, the word line driver WDRV applies a writing voltage Vpgm to a selected word line WLs. This performs writing to the selected memory cell MCsi connected to the selected bit line and the selected word line WLs.

Then, in step S106, the controller 5 sets the suffix "i" of the selected memory cell MCsi to an initial value "0" so as to verify the selected memory cell MCsi in the order of "i".

Then, in step S108, the controller 5 determines the necessity or non-necessity of verify processing. The controller 5 skips verify processing of the selected memory cell MCsi set to a write-inhibited state (YES in step S108), and then in step S114, increments "i" to "i+1". Then, while causing the selected memory cell MCsi, which is set to a write-inhibited state, to remain in a non-selected state, the controller 5 proceeds to processing of a next selected memory cell MCsi+1 (NO in step S124).

If the selected memory cell MCsi is in a write-permitted state (NO in step S108), then in step S110, the controller 5 determines whether additional writing is in progress. The controller 5 can determine whether additional writing is in progress by referring to flags previously stored in the data memory circuit 8. The flags can be 1-bit data corresponding to each selected memory cell MCs.

(Threshold Voltage being Lower than Level A)

If additional writing is not in progress (NO in step S110), the selected memory cell MCsi is being processed in an ordinary writing loop. Accordingly, in step S111, the controller 5 performs the verify read operation on the selected memory cell MCsi, and then in step S112, determines whether the threshold voltage of the selected memory cell MCsi has reached the level A.

If the threshold voltage of the selected memory cell MCsi has not reached the level A (NO in step S112), then in step S114, the controller 5, while causing the selected memory cell MCsi to remain in a selected state and without raising the flag of additional writing, increments "i" to "i+1". In this case, the threshold voltage of the selected memory cell MCsi is in the state of being lower than the level A. Accordingly, the controller 5, while causing the selected memory cell MCsi to remain in a selected state and without proceeding to additional writing, proceeds to processing of a next selected memory cell MCsi+1 (NO in step S124).

After execution of steps S108 to S124 in the order of "i", when "i" exceeds "n" (YES in step S124), then in step S126, the controller 5 determines whether the number of selected memory cells MCs in a write-permitted state (in a selected state) is a predetermined number N1 or less. If the number of selected memory cells MCs in a write-permitted state is greater than the predetermined number N1 (NO in step S126), this indicates that there are a great number of selected memory cells MCsi on which writing is not yet completed. Accordingly, in step S128, the controller 5 steps up the writing voltage of the selected word line WLs from "Vpgm" to "Vpgm+ΔVpgm", and then performs a subsequent writing loop (steps S102 to S124). In this instance, in step S102, the controller 5 fixes the bit line BL on which writing has been completed to a write-inhibited state (for example, a high-level voltage), and then does not perform data writing to the corresponding selected memory cell MCs in the subsequent writing loops. On the other hand, the controller 5 causes the bit line BL on which writing is not yet completed to remain in a write-permitted state (for example, a low-level voltage), and then performs data writing to the corresponding selected memory cell MCs in the subsequent writing loops.

In this way, in steps S102 to S126, the controller 5 causes a selected memory cell MCsi (i=0 to n) that has not reached the level of write data to remain in a write-permitted state, and performs a writing loop while stepping up the writing voltage of a selected word line WLs. Furthermore, in steps S108 to S124, the controller 5, while incrementing "i", performs the verify read operation with respect to a selected memory cell MCsi (i=0 to n).

Furthermore, in the beginning when the writing sequence is started, since selected memory cells MCs are at the level Er, the threshold voltages of most selected memory cells MCsi have not yet reached either the level A or the level of write data. Accordingly, in the beginning, the selected memory cell MCsi is processed in an ordinary writing loop. Moreover, while, in the above-described example, the verify operation is sequentially performed with respect to the selected memory cells MCsi (i=0 to n), actually, since the sense amplifiers are provided for respective bit lines, the verify read operation is performed almost simultaneously and in parallel with respect to the selected memory cells MCsi (i=0 to n). Additionally, even in a case where the sense amplifiers are not provided for respective bit lines, a parallel circuit can be used to simultaneously perform the verify read operation with respect to a plurality of selected memory cells MCsi.

(Setting of Additional Writing: Threshold Voltage being at Level A or Higher)

When, as the ordinary writing loop is iterated, the threshold voltage of a selected memory cell MCsi has reached the level A (YES in step S112), then in step S116, the controller 5 shifts the selected memory cell MCsi to additional writing. At this time, the controller 5 sets a flag of additional writing stored in the data memory circuit 8 (reverses the logic), thus indicating that the selected memory cell MCsi is in the process of additional writing. At the same time, the controller 5 sets a count number k (i) corresponding to a writing level. The count number k (i) is the number of times of execution of additional writing to a selected memory cell MCsi corresponding to write data. For example, the count number k (i) is any one of numerical values "0" to "6" respectively corresponding to the levels A to G, as mentioned above. The count number k (i) is assigned to each of selected memory cells MCsi that have reached the level A (to each bit thereof), and is stored in the data memory circuit 8.

Then, in step S114, the controller 5 causes the selected memory cell MCsi to remain in a selected state (write-permitted state) and increments "i" to "i+1". Then, while causing the selected memory cell MCsi to remain in a selected state, the controller 5 proceeds to processing of a next selected memory cell MCsi+1 (NO in step S124).

After performing steps S108 to S124 with respect to all of the selected memory cells MCsi (YES in step S124), the controller 5 returns to step S102 via the above-mentioned steps S126 and S128.

In this way, in step S116, the controller 5 sets the number of times "k" of execution of additional writing with respect to each of all of the selected memory cells MCsi (i=0 to n) that have exceeded the level A.

(Execution of Additional Writing: Threshold Voltage being at Level A or Higher)

If, in step S110, the flag of additional writing is set and the additional writing is in progress (YES in step S110), then in step S118, the controller 5 decrements the count number k(i) without performing the verify read operation with respect to the selected memory cell MCsi. Accordingly, the count number k(i) is decremented by one each time the write operation (steps S102 and S104) is performed after the additional writing state is set.

If the count number k(i) is not "0" (NO in step S120), then in step S114, the controller 5 increments "i" to "i+1" while causing the selected memory cell MCsi to remain in a selected state. Then, the controller 5 causes the selected memory cell MCsi to remain in a selected state, and then proceeds to processing of a next selected memory cell MCsi+1 (NO in step S124).

If "i" has exceeded "n" (YES in step S124), the controller 5 returns to step S102 via steps S126 and S128.

When the additional writing (steps S102 to S110, S118, S120, S114, and S124 to S128) has been performed the number of times corresponding to a predetermined count number k(i), the count number k(i) becomes "0" (YES in step S120). In this case, in step S122, the controller 5 sets the selected memory cell MCsi to a write-inhibited state, and then in step S114, increments "i" to "i+1". The bit line BL connected to the selected memory cell MCsi set to a write-inhibited state is fixed to a high-level voltage.

In this way, the controller 5, while incrementing "i", performs additional writing the count number "k" with respect to the selected memory cell MCsi (i=0 to n) set to the additional writing state.

As described above, a selected memory cell MCsi is subjected to writing in an ordinary writing loop until the threshold voltage thereof reaches the level A, and, when the threshold voltage thereof has reaches the level A, is set to the additional writing state, thus being excluded as a target of the verify read operation. Then, the selected memory cell MCsi is subjected to writing in an additional write operation a predetermined count number k(i) corresponding to write data. This completes the foggy writing according to the present embodiment.

Furthermore, selected memory cells MCsi (i=0 to n) in a page have respective different threshold voltages. Accordingly, in a single cycle of processing in steps S108 to S124, the selected memory cells MCsi (i=0 to n) are not always subjected to the same processing, but may be subjected to respective different processing operations (inhibition of writing, ordinary writing loop, setting of additional writing, or writing loop of additional writing).

(Fine Writing)

The fine writing, which is performed after the foggy writing, is a stage of accurately writing each piece of data within a threshold range narrower than that of the foggy writing. The threshold voltage of the selected memory cell MCs subjected to rough writing by the foggy writing is caused by the fine writing to fall within an intended threshold range as illustrated in FIG. 4C.

In the fine writing, a new writing loop is iteratively performed. When the selected memory cell MCs serving as a writing target have passed (succeeded in) the verify read operation corresponding to the levels A to G, the fine writing ends. The verify levels are set in such a manner as to increase in the order of A, B, C, D, E, F, G. In other words, in the fine writing, the verify levels respectively corresponding to the threshold voltage levels (A to G) of write data are used. The verify levels of the levels A to G are approximately equal to the reference voltages used in an ordinary read operation. With this, the threshold voltages of selected memory cells MCs are caused by the fine writing to fall within respective intended threshold voltage distributions corresponding to the levels A to G in the selected memory cells MCs. Even in the fine writing, the selected memory cell MCs that is at the level Er remains in that state and is not subjected to writing. With this, pieces of 3-bit data of levels Er to G are written to the selected memory cells MCs.

FIG. 8 is a graph illustrating word line voltages $V_{WL}$ in the fine writing. The ordinate axis indicates the word line voltage $V_{WL}$, and the abscissa axis indicates time. As illustrated in FIG. 8, after performing writing to the selected memory cell MCs at the writing voltage Vpgm, the controller 5 performs the verify operation with respect to each of the levels A to G in the verify read operation.

In a next writing loop, the writing voltage Vpgm is raised as much as the step-up width ΔVpgm. The selected memory cell MCs that has reached the level of write data enters a non-selected state (write-inhibited state) in such a way as to prevent writing from being performed in the subsequent writing loops. In other words, the bit line BL corresponding to the selected memory cell MCs that has passed the verify operation is fixed to a high-level voltage.

Iterating such a writing loop enables obtaining a threshold voltage distribution illustrated in FIG. 4C.

In the foggy writing, after the threshold voltage of the i-th selected memory cell MCsi has reached the level A (first level), the memory according to the present embodiment performs additional writing the number of times corresponding to the count number k (i) (a predetermined number of times) corresponding to write data to be written to the selected memory cell MCsi. With this, in the writing loop, the verify read operations for the respective levels B to G other than the level A become unnecessary, so that each writing loop time can be reduced. For example, although a simple comparison is not accurate, referring to a writing loop time Tloop1 illustrated in FIG. 5 and a writing loop time Tloop2 illustrated in FIG. 8 enables understanding that the foggy writing period Tloop1 in the present embodiment is very short. This enables greatly shortening a period for foggy writing, thus shortening the time period for the entire writing operation.

Alternatively, an additional time corresponding to the reduction in time achieved during the foggy writing can be spent for the fine writing. For example, FIGS. 9A and 9B are conceptual diagrams illustrating data writing times.

Figure 9A:
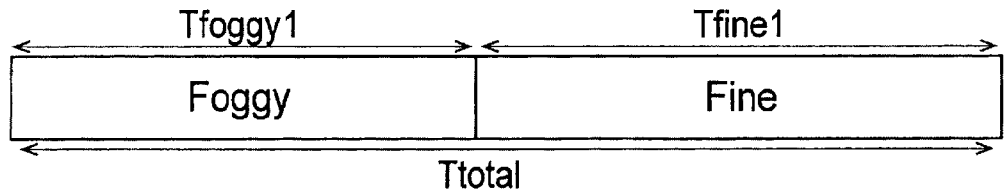
FIGS. 9A and 9B are conceptual diagrams illustrating data writing times.
Figure 9B:
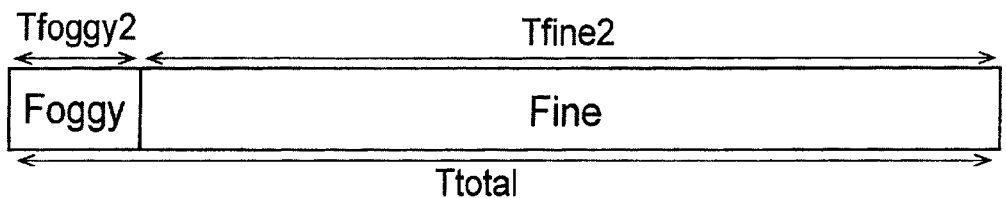

Referring to FIG. 9A, in the foggy writing, the verify read operations for the levels A to G are being performed. Accordingly, the foggy writing time Tfoggy1 is relatively long. Referring to FIG. 9B, in the foggy writing, the above-described foggy writing according to the present embodiment is performed. Accordingly, the foggy writing time Tfoggy2 is very much shorter than the foggy writing time Tfoggy1. The fine writing time Tfine2 can be lengthened as much as the reduction in foggy writing time Tfoggy2 without increasing the total writing time. Comparing FIG. 9A and FIG. 9B, it can be seen that, although the time Ttotal of the entire writing is the same, the fine writing time Tfine2 is significantly longer than the fine writing time Tfine1. In this way, since more time is spent on the fine writing time Tfine2, the threshold voltage distribution obtained after writing can be much narrowed (sharpened). For example, if the step-up width ΔVpgm is made smaller and the threshold voltage of a selected memory cell MCs is raised little by little, although the fine writing time Tfine2 increases in length, the threshold voltage distributions for the respective levels A to G can be very narrowed. In this way, the memory according to the present embodiment is able to narrow the threshold voltage distribution of memory cells without increasing a writing time.

Furthermore, in the above-described embodiment, the level A is supposed to be the first level, and additional writing is performed after the threshold voltage of a selected memory cell MCs exceeds the level A. However, the first level can be any one of the levels B to G other than the level A.

Moreover, the present embodiment can employ a Quick Pass Write (QPW) method. In the QPW method, when the threshold voltage of a selected memory cell exceeds a verify low level, in a next writing loop, the voltage of a bit line corresponding to the selected memory cell is raised as much as ΔVch (ΔVch being, for example, 0 to 2×ΔVpgm). With this, the bit line controller BLC reduces the rise of a writing voltage applied to the selected memory cell that has exceeded the verify low level, and, in a subsequent writing loop, raises the threshold voltage of the selected memory cell MCs little by little. After that, when the above-mentioned threshold voltage has exceeded a verify high level, the writing sequence for the selected memory cell MCs ends. Such a QPW method can also be employed for fine writing.

Additionally, in the present embodiment, writing using additional writing is used for foggy writing. However, writing using additional writing can also be used for fine writing. In this case, the threshold voltage distribution is somewhat widened, but the writing speed can be increased.

Modification Example 1

Figure 10:
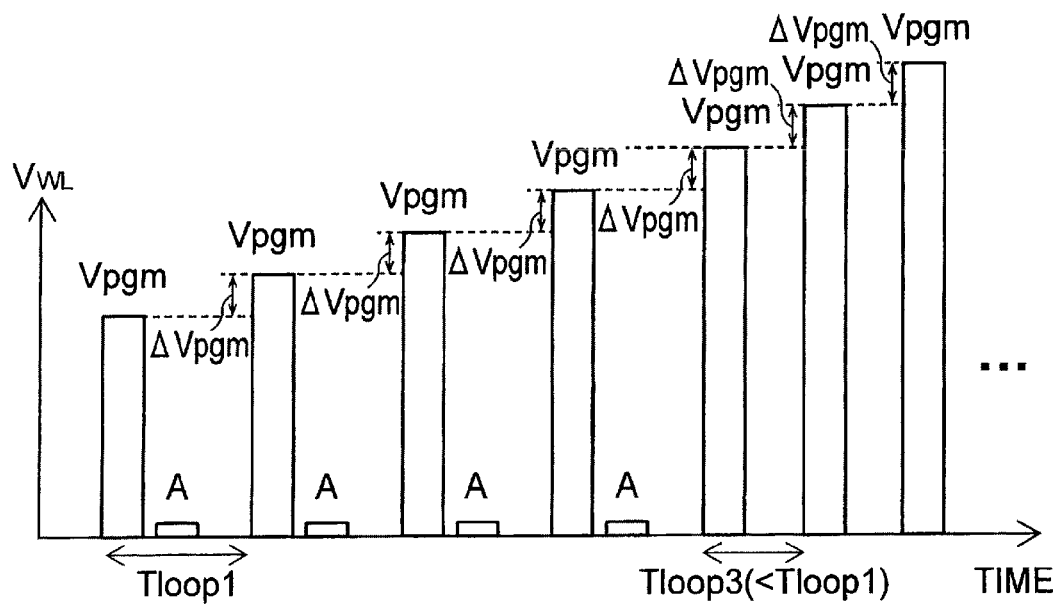
FIG. 10 is a graph illustrating word line voltages $V_{WL}$ in foggy writing according to a modification example 1 of the first embodiment.

FIG. 10 is a graph illustrating word line voltages $V_{WL}$ in the foggy writing according to a modification example 1 of the first embodiment. In the modification example 1, when, the writing loop is iteratively performed, almost all of the selected memory cells MCsi have reached levels equal to or greater than the level A or have entered a write-inhibited state, the controller 5 then omits the verify read operation for the level A. In other words, when almost all of the selected memory cells MCsi have entered one of an additional writing state (YES in step S110 illustrated in FIG. 7) and a write-inhibited state (YES in step S108), in each of the subsequent writing loops, the controller 5 performs the write operation, but omits the verify read operation (a no-verify loop).

Furthermore, in the modification example 1, when the number of selected memory cells MCs that have not reached the level A has become a predetermined value or less (for example, 0.1% or less of the total number of selected memory cells MCs), the controller 5 can perform the no-verify loop.

According to the modification example 1, when the threshold voltages of almost all of the selected memory cells MCsi have reached the level A or almost all of the selected memory cells MCsi have entered a write-inhibited state, the controller 5 omits the verify read operation, which is unnecessary in the no-verify loop. With this, the memory according to the modification example 1 is able to further shorten the writing loop time. For example, the time Tloop3 of the writing loop in the no-verify loop is shorter than the writing loop time Tloop1 involving the verify read operation. This enables shortening a period for foggy writing, thus further shortening a period for the entire writing.

Modification Example 2

Figure 11:
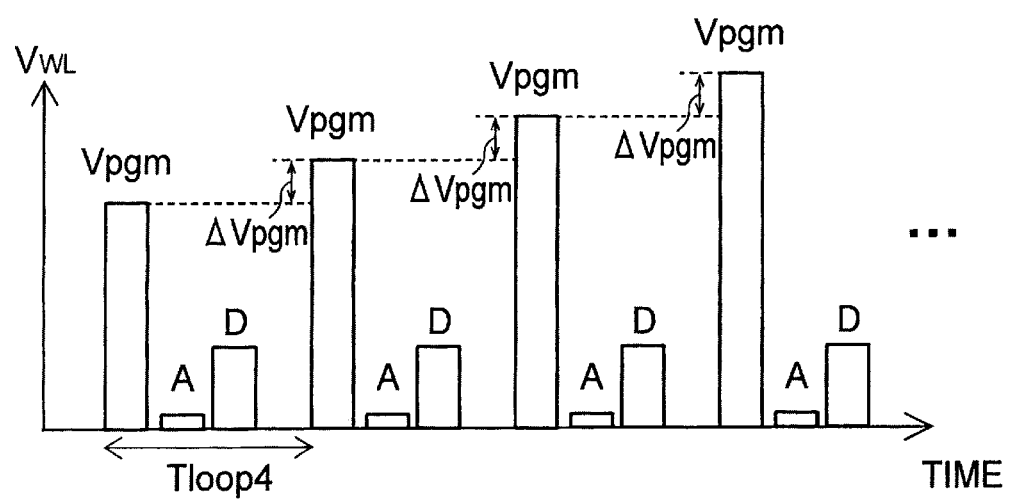
FIG. 11 is a graph illustrating word line voltages $V_{WL}$ in foggy writing according to a modification example 2 of the first embodiment.

FIG. 11 is a graph illustrating word line voltages $V_{WL}$ in the foggy writing according to a modification example 2 of the first embodiment. In the modification example 2, after performing writing to the selected memory cell MCs at the writing voltage Vpgm, the controller 5 performs the verify read operation for the levels A and D, but does not perform the verify read operation for the levels B, C, E, F, and G.

In the modification example 2, in the case of writing data of the level B or C to the selected memory cell MCs, the controller 5 performs additional writing after the level A is reached. In the case of writing data of the level E, F, or G to the selected memory cell MCs, the controller 5 performs additional writing after the level D is reached.

In the case of writing data of the level A or D to the selected memory cell MCs, additional writing does not need to be performed. In the case of writing data of the level B to the selected memory cell MCs, the controller 5 can perform additional writing once after the threshold voltage of the selected memory cell MCs has reached the level A. In the case of writing data of the level C to the selected memory cell MCs, the controller 5 can perform additional writing twice after the threshold voltage of the selected memory cell MCs has reached the level A. In the case of writing data of the level E to the selected memory cell MCs, the controller 5 can perform additional writing once after the threshold voltage of the selected memory cell MCs has reached the level D. In the case of writing data of the level F to the selected memory cell MCs, the controller 5 can perform additional writing twice after the threshold voltage of the selected memory cell MCs has reached the level D. In the case of writing data of the level G to the selected memory cell MCs, the controller 5 can perform additional writing three times after the threshold voltage of the selected memory cell MCs has reached the level D.

In this way, in the modification example 2, the controller 5 performs the verify read operation with respect to a plurality of levels A and D, and does not perform the verify read operation with respect to the other levels B, C, E, F, and G. In the case of writing data of the level B or C, which is between the level A and the level D, after the threshold voltage of a selected memory cell MCsi has reached the level A (first level), the controller 5 performs additional writing the count number k(i) (a predetermined number of times) corresponding to write data to be written to the selected memory cell MCsi. In the case of writing pieces of data of the levels A, B, and C, the count numbers k(i) are "0", "1", and "2", respectively.

In the case of writing data of the level E, F, or G, which is higher than the level D, after the threshold voltage of a selected memory cell MCsi has reached the level D (second level), the controller 5 performs additional writing, the count number k(i) corresponding to write data to be written to the selected memory cell MCsi. In the case of writing pieces of data of the levels D, E, F, and G, the count numbers k(i) are "0", "1", "2", and "3", respectively.

In this way, in the verify read operation, the verify operation for some of the levels can be omitted, while the verify operation for the other plurality of levels can be performed. However, the larger the number of levels for which the verify operation is performed, the longer the writing loop time becomes. For example, the writing loop time Tloop4 in the modification example 2 is longer than the writing loop time Tloop1 illustrated in FIG. 5.

On the other hand, in the modification example 2, since the verify operation is performed for a plurality of levels, the threshold voltage distribution for each level can be made narrow after the end of the foggy writing. For example, in the above-described first embodiment, in the case of writing data of the level G, a selected memory cell MCs, after reaching the level A, is subjected to additional writing six times. During the additional writing performed six times, the selected memory cell MCs is not subjected to the verify read operation. On the other hand, in the modification example 2, in the case of writing data of the level G, the selected memory cell MCs, after reaching the level D, is subjected to additional writing only three times. Accordingly, the variation (distribution) of threshold voltages of selected memory cells MCs is smaller in the modification example 2 than in the first embodiment.

The modification example 1 and the modification example 2 can be combined.

Furthermore, the number of times of additional writing can be the same (in common) with respect to a plurality of adjacent levels of write data. For example, with regard to selected memory cells MCs to which elements of data of the levels B and C are to be written, the number of times of additional writing is set to one. In this case, after the threshold voltages of the selected memory cells MCs have reached the verify level, which is the level A, additional writing is performed once. With regard to selected memory cells MCs to which to write pieces of data of the levels D and E, the number of times of additional writing is set to two. In this case, after the threshold voltages of the selected memory cells MCs have reached the verify level, which is the level A, additional writing is performed twice. With regard to selected memory cells MCs to which to write pieces of data of the levels F and G, the number of times of additional writing is set to three. In this case, after the threshold voltages of the selected memory cells MCs have reached the verify level, which is the level A, additional writing is performed three times. In this case, the step-up width ΔVpgm can be set to about two times a voltage difference between adjacent verify levels.

While, in the above-described embodiment, the memory cell MC is a TLC, the memory cell MC can be an MLC or a QLC or a higher-level one. An example in which the above-described embodiment or modification example is applied to a QLC is briefly described below.

(QLC)

In a case where the first embodiment is applied to a QLC, since write data is 4-bit data, the writing levels include, in addition to level Er, levels A to O (first to fifteenth levels). In this case, as in the first embodiment, in a writing sequence, after the threshold voltage of a selected memory cell MCs has reached the level A, the controller 5 can perform the write operation the number of times of additional writing (0 to fifteen times) corresponding to write data (one of levels A to O). In this case, the number of times of additional writing is equal to the number of levels higher than the level A and equal to or lower than the threshold voltage level (one of levels B to O) of write data to be written to the selected memory cell MCs. Moreover, the threshold voltage of the selected memory cell MCs rises according to the alphabetical order of the levels A to O.

However, since a QLC has a large number of writing levels, the number of times of additional writing can be set in common with respect to a plurality of threshold voltage levels. For example, with regard to selected memory cells MCs to which to write pieces of data of the levels B to E, the number of times of additional writing is set to one, with regard to selected memory cells MCs to which to write pieces of data of the levels F to I, the number of times of additional writing is set to two, with regard to selected memory cells MCs to which to write pieces of data of the levels J to L, the number of times of additional writing is set to three, and with regard to selected memory cells MCs to which to write pieces of data of the levels M to O, the number of times of additional writing is set to four. In this way, the number of times of additional writing in the foggy writing can be set. With this, even in a case where the number of writing levels is large, foggy writing of write data to selected memory cells MCs can be efficiently performed in a short amount of time. Naturally, the relationship between the writing levels and the number of times of additional writing can be optionally set.

Furthermore, the modification example 2 can be applied to a QLC. In this case, the controller 5 performs the verify read operation with respect to a plurality of levels, but does not perform the verify read operation with respect to the other levels. Hereinafter, a level with respect to which to perform the verify read operation is also referred to as a "verify level". In this case, after the threshold voltage of a selected memory cell MCs has reached a verify level that is equal to or lower than the level of write data and is closest to the level of write data, the controller 5 performs the write operation the number of times corresponding to the write data. For example, the levels A, E, I, and M are supposed to be verify levels. In this case, with regard to a selected memory cell MCs to which to write data of the level B, after the threshold voltage of the selected memory cell MCs has reached the level A, the controller 5 performs additional writing once. With regard to a selected memory cell MCs to which to write data of the level C, after the threshold voltage of the selected memory cell MCs has reached the level A, the controller 5 performs additional writing twice. With regard to a selected memory cell MCs to which to write data of the level D, after the threshold voltage of the selected memory cell MCs has reached the level A, the controller 5 performs additional writing three times. With regard to a selected memory cell MCs to which to write data of the level F, after the threshold voltage of the selected memory cell MCs has reached the level E, the controller 5 performs additional writing once. With regard to a selected memory cell MCs to which to write data of the level G, after the threshold voltage of the selected memory cell MCs has reached the level E, the controller 5 performs additional writing twice. With regard to a selected memory cell MCs to which to write data of the level H, after the threshold voltage of the selected memory cell MCs has reached the level E, the controller 5 performs additional writing three times. With regard to a selected memory cell MCs to which to write data of the level J, after the threshold voltage of the selected memory cell MCs has reached the level I, the controller 5 performs additional writing once. With regard to a selected memory cell MCs to which to write data of the level K, after the threshold voltage of the selected memory cell MCs has reached the level I, the controller 5 performs additional writing twice. With regard to a selected memory cell MCs to which to write data of the level L, after the threshold voltage of the selected memory cell MCs has reached the level I, the controller 5 performs additional writing three times. With regard to a selected memory cell MCs to which to write data of the level N, after the threshold voltage of the selected memory cell MCs has reached the level M, the controller 5 performs additional writing once. With regard to a selected memory cell MCs to which to write data of the level O, after the threshold voltage of the selected memory cell MCs has reached the level M, the controller 5 performs additional writing twice. Moreover, with regard to selected memory cells MCs to which to write pieces of data of the levels A, E, I, and M serving as verify levels, additional writing becomes unnecessary. In this way, the above-described modification example 2 can also be applied to a QLC. With this, even in a case where the number of writing levels is large, foggy writing of write data to selected memory cells MCs can be efficiently performed in a shorter amount of time. Naturally, the modification example 1 can also be applied to a QLC.

Furthermore, the above-described first embodiment and modification examples 1 and 2 can be applied to not only a two-dimensionally structured memory, in which a memory cell array is arranged in a planar shape, but also a threedimensionally structured memory, in which a memory cell array is arranged in three dimensions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of word lines;
   a plurality of bit lines;
   a plurality of memory cells at intersections of the word lines and the bit lines;
   a word line driver configured to apply a voltage to a selected word line from among the plurality of word lines;
   a sense amplifier configured to detect data of memory cells; and
   a controller configured to control the word line driver and the sense amplifier, wherein
   a writing sequence of writing data to a selected memory cell connected to the selected word line includes a plurality of writing loops including a write operation during which the word line driver applies a writing voltage to the selected word line and a verify operation during which the sense amplifier detects data of the selected memory cell, and
   the controller is configured to perform the write operation on the selected memory cell a predetermined number of times corresponding to write data to be written to the selected memory cell, without the verify operation, after a threshold voltage of the selected memory cell connected to the selected word line reaches a first level.

2. The device according to claim 1, wherein the first level is less than a threshold voltage level corresponding to the write data to be written to the selected memory cell.

3. The device according to claim 2, wherein the predetermined number of times is established based on each of the threshold voltage levels of the write data to be written to the selected memory cell, and
   the semiconductor memory device further comprises a memory unit in which a correspondence relationship between the threshold voltage levels and the predetermined number of times corresponding to each of the threshold voltage levels is stored.

4. The device according to claim 1, further comprising:
   a memory unit in which the predetermined number of times corresponding to respective memory cells connected to the selected word line is stored.

5. The device according to claim 1, wherein the first level is a threshold voltage level that is higher by one or more levels than a lowest level among the threshold voltage levels of the write data.

6. The device according to claim 1, wherein the predetermined number of times is equal to a number of threshold voltage levels that are higher than the first level from among the threshold voltage levels of the write data.

7. The device according to claim 1, wherein, in the writing sequence, after the threshold voltage of the selected memory cell connected to the selected word line reaches the first level, the controller performs the write operation on the selected memory cell an equal number of times regardless of the threshold voltage level corresponding to the write data.

8. The device according to claim 1, wherein
   in a first writing sequence, after the threshold voltage of the selected memory cell connected to the selected word line reaches the first level, the controller performs the write operation on the selected memory cell the predetermined number of times, and then
   in a second writing sequence, the controller performs the verify operation using a verify level corresponding to the threshold voltage level of the write data.

9. The device according to claim 1, wherein, in the writing sequence, in a case where the selected memory cell has entered a write-inhibited state, the controller omits execution of the verify operation in the writing loop.

10. The device according to claim 1, wherein, in the verify operation, the sense amplifier detects at least data of the first level and data of a second level different from the first level,
    in a case where the write data for a memory cell is at a level between the first level and the second level, in the writing sequence, after the threshold voltage of the memory cell reaches the first level, the controller performs the write operation on the memory cell a predetermined number of times corresponding to the write data, and
    in a case where the write data for a memory cell is at the second level or higher level, in the writing sequence, after the threshold voltage of the memory cell reaches the second level, the controller performs the write operation on the memory cell a predetermined number of times corresponding to the write data.

11. A method of writing data to memory cells, the data being associated with one of a plurality of voltage levels, comprising:
    applying a write voltage in multiple loops of a coarse writing sequence to a plurality of memory cells into which data are to be written, the write voltage increasing each time through the loop;
    verifying for a selected memory cell of the plurality of memory cells if the selected memory cell has reached a first voltage level; and
    if the selected memory cell has reached the first voltage level, continuing to apply the write voltage to the selected memory cell through the loops while not verifying a voltage level of the selected memory cell.

12. The method according to claim 11, further comprising:
    applying a write voltage in multiple loops of a fine writing sequence to the selected memory cell that has reached the first voltage level while verifying the voltage level of the selected memory cell, until the memory cell has reached a target voltage level higher than the first voltage level.

13. The method according to claim 11, further comprising:
    verifying for another memory cell of the plurality of memory cells if the memory cell has reached a second voltage level higher than the first voltage level; and
    if said memory cell has reached the second voltage level, continuing to apply the write voltage to said another memory cell through the loops while not verifying a voltage level of said another memory cell.

14. The method according to claim 13, further comprising:
    applying a write voltage in multiple loops of a fine writing sequence to said another memory cell that has reached the second voltage level while verifying the voltage level of the said another memory cell, until said another memory cell has reached a target voltage level higher than the second voltage level.

15. The method of claim 11, further comprising:
determining a percentage of memory cells among the plurality of memory cells that have reached the first voltage level or a respective target voltage levels thereof; and
stopping verification of the first voltage level in the remaining memory cells of the plurality of the memory cells when a threshold percentage has been reached.

16. A semiconductor memory device comprising:
word lines, bit lines and a plurality of memory cells at intersections of the word line and bit lines;
a driver configured to apply a voltage to a selected word line;
a sense amplifier configured to detect a threshold voltage level of the memory cells; and
a controller configured to control the driver and the sense amplifier, wherein
a writing sequence of writing data to memory cells connected to the selected word line includes a plurality of writing loops including a write operation during which the driver applies a write voltage to the selected word line and a verify operation during which the sense amplifier detects threshold voltages of the memory cells, and
the controller is configured to perform the write operation and the verify operation for a first memory cell connected to the selected word line until the sense amplifier detects the first memory cell to have reached a first voltage level which is less than a target voltage level for the first memory cell and thereafter to perform the write operation on the first memory cell a predetermined number of times without the verify operation.

17. The device according to claim 16, wherein the controller is configured to perform the write operation and the verify operation for a second memory cell connected to the selected word line until the sense amplifier detects the second memory cell to have reached a second voltage level which is higher than the first voltage level and less than a target voltage level for the second memory cell and thereafter to perform the write operation a predetermined number of times on the second memory cell without the verify operation.

18. The device according to claim 17, wherein the predetermined number of times is established based on the target voltage level of the second memory cell.

19. The device according to claim 16, wherein the predetermined number of times is established based on the target voltage level of the first memory cell.

20. The device of claim 16, wherein the controller is configured to perform the write operation without the verify operation on a second memory cell that has not reached the first voltage level after a predetermined percentage of the memory cells connected to the selected word line have reached the first voltage level or respective target voltage levels thereof.

* * * * *